(12) United States Patent
Kamada

(10) Patent No.: US 8,410,844 B2
(45) Date of Patent: Apr. 2, 2013

(54) FILTER DEVICE AND CONTROL METHOD OF THE SAME

(75) Inventor: Mikio Kamada, Tokyo (JP)

(73) Assignee: Asahi Kasei Microdevices Corporation, Tokyo (JP)

(*) Notice: Subject to any disclaimer, the term of this patent is extended or adjusted under 35 U.S.C. 154(b) by 0 days.

(21) Appl. No.: 13/258,581

(22) PCT Filed: Mar. 30, 2011

(86) PCT No.: PCT/JP2011/001913
§ 371 (c)(1),
(2), (4) Date: Sep. 22, 2011

(87) PCT Pub. No.: WO2011/122024
PCT Pub. Date: Oct. 6, 2011

(65) Prior Publication Data
US 2012/0049944 A1    Mar. 1, 2012

(30) Foreign Application Priority Data

Mar. 31, 2010 (JP) ................................. 2010-084244
Jul. 12, 2010 (JP) ................................. 2010-157766

(51) Int. Cl.
*H03K 5/00* (2006.01)
(52) U.S. Cl. ........................................ 327/554; 327/552
(58) Field of Classification Search .......... 327/551–559, 327/336–337
See application file for complete search history.

(56) References Cited

U.S. PATENT DOCUMENTS 3,787,851 A * 1/1974 Hughes ........................ 342/161
(Continued)

FOREIGN PATENT DOCUMENTS

| JP | 46-001610 | 9/1971 |
| JP | 50-017747 | 2/1975 |
| JP | 53-126842 | 11/1978 |
| JP | 63-026111 | 2/1988 |

(Continued)

OTHER PUBLICATIONS

Motogi et al., RF Tunable Recursive Filter, Institute of Electronics, Information and Communication Engineers, IEICE Technical Report, US2008-42, pp. 57-61, Sep. 2008.

*Primary Examiner* — Dinh T. Le
(74) *Attorney, Agent, or Firm* — Morgan, Lewis & Bockius LLP

(57) ABSTRACT

There is provided a filter device having a function of adjusting the center frequency of a filter. The filter device includes: a filter core unit (102) provided with an adder (109) for outputting an added signal of an input signal and a feedback signal (signal Vf), an AGC circuit for generating an amplification signal in which the added signal is amplified, and a phase shifter (111) for generating the signal Vf by shifting a phase of the amplification signal; an amplitude comparing circuit (101) for comparing the reference amplitude and the amplitude of the signal Vf; a gain control voltage generator (108) for controlling the amplification factor of the AGC circuit (110) based upon the comparison result; a frequency comparing circuit (103) for comparing the reference frequency and the frequency of the signal Vf; a phase shifter control voltage generator (117) for controlling the shift amount of the phase in the phase shifter (111) based upon the comparison result. The gain control voltage generator (108) oscillates the filter core unit (102), while the amplification factor and the shift amount are being controlled.

14 Claims, 6 Drawing Sheets

| U.S. PATENT DOCUMENTS | | | | FOREIGN PATENT DOCUMENTS | | |
|---|---|---|---|---|---|---|
| 4,158,818 A | 6/1979 | Lerner | | JP | 01-317014 | 12/1989 |
| 4,818,903 A | 4/1989 | Kawano | | JP | 2001-512650 | 8/2001 |
| 5,447,366 A * | 9/1995 | Cole | 312/50 | JP | 2001-274654 | 10/2001 |
| 6,057,735 A | 5/2000 | Cloutier | | JP | 2007-281604 | 10/2007 |
| 6,778,023 B2 | 8/2004 | Christensen | | JP | 2008-301182 | 12/2008 |
| 7,050,762 B2 | 5/2006 | Boldt et al. | | JP | 2009-117913 | 5/2009 |
| 7,446,600 B2 | 11/2008 | Kosai | | JP | 2009-284142 | 12/2009 |
| 7,474,160 B2 * | 1/2009 | Erdogan et al. | 331/59 | | | |
| 7,619,465 B2 | 11/2009 | Kondo et al. | | | | |

* cited by examiner

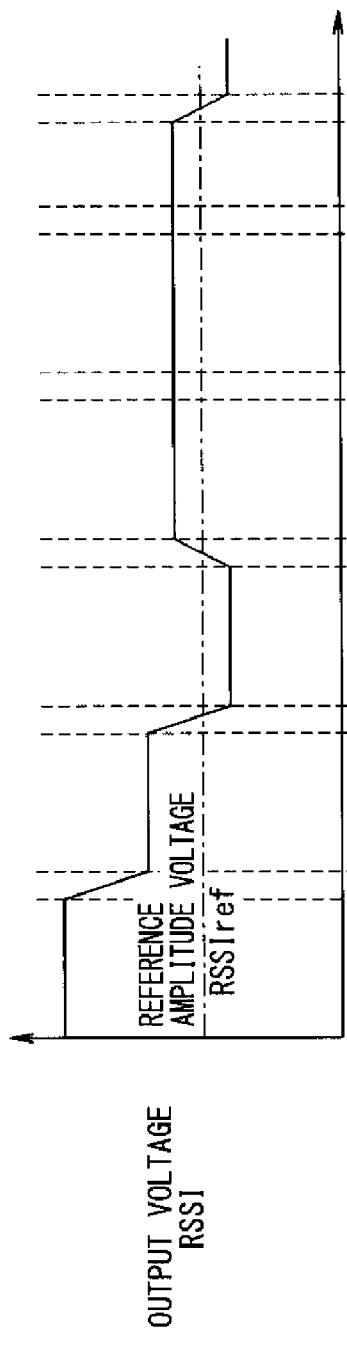
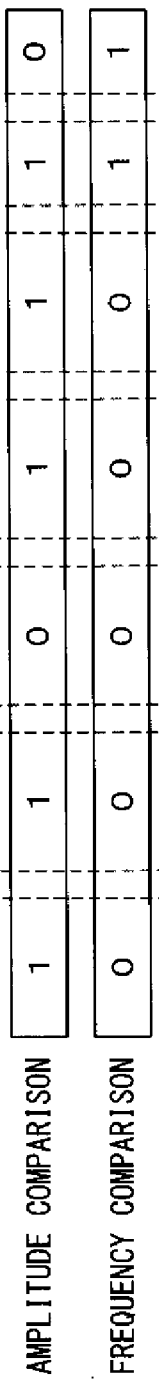
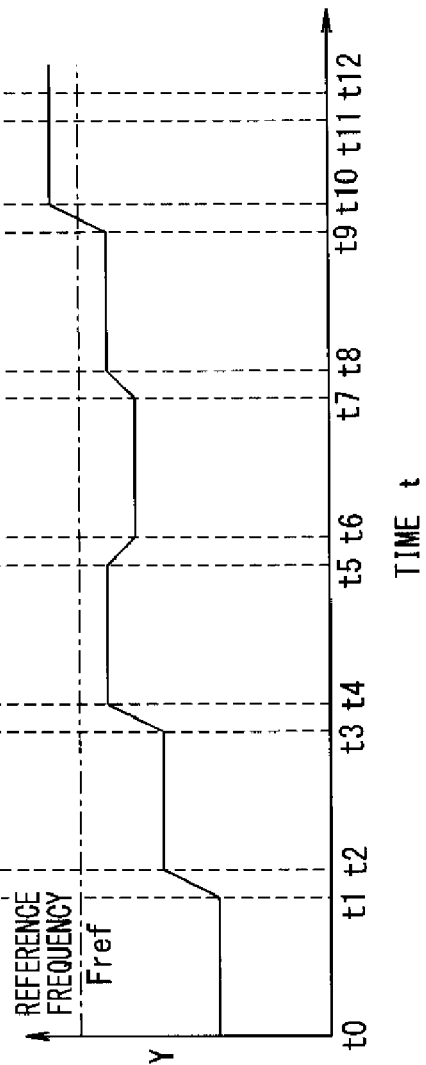
FIG. 5A
FIG. 5B
FIG. 5C

US 8,410,844 B2

FILTER DEVICE AND CONTROL METHOD OF THE SAME

The present application is the national stage application of PCT/JP2011/001913, filed Mar. 3, 2011, which claims priority to Japanese Patent Application No. 2010-084244, filed Mar. 31, 2010, and Japanese Patent Application No. 2010-157766, filed Jul. 12, 2010, the contents of which are incorporated herein by reference.

TECHNICAL FIELD

The present invention relates to a filter device and a control method thereof, in particular, to a filter device including a filter circuit with a positive feedback such as a recursive filter circuit and a control method thereof.

BACKGROUND ART

At present, a passive element such as a Surface Acoustic Wave (SAW) filter is mainly used as a filer circuit for Radio Frequency (RF) signals. In such filter circuits, the output signal does not have an output gain, thereby causing noise degradations of signals. Since the SAW filters have a narrow adaptive frequency domain, multiple filter circuits are needed to cover a wide bandwidth.

As a filter for eliminating the above drawback of the SAW filters, there is a recursive filter circuit, for example. The recursive filter circuit is also called positive feedback filter circuit, includes positive feedback therein, has a wide adaptive frequency domain, and is capable of covering a wide bandwidth.

FIG. 7 is a view for showing a conventional recursive filter circuit. The conventional recursive filter circuit is composed of: a Low Noise Amplifier (LNA) 201, a variable gain amplifier 204, a phase shifter 203, and an adder 202. In the circuit shown in FIG. 7, when the amplitude and phase of an output signal Vout from the adder 202 are substantially same with the amplitude and phase of a feedback signal Vf from the variable gain amplifier 204 and the phase shifter 203, this circuit obtains a large gain at a certain frequency and functions as a filter circuit.

The control of the recursive filter circuit shown in FIG. 7 will now be described.

The transfer function of the recursive filter circuit shown in FIG. 7 is given by the following expression (1).

$$H = GL/(1 - Gg|K|\exp(j\angle K))$$  expression (1)

In the above expression (1), GL represents a gain of the LNA 20, Gg represents a gain of the variable gain amplifier 204, and K represents a transfer function of the phase shifter 203. The gain of the adder 202 is substantially 1.

When the denominator of the expression (1) is substantially 0, the recursive filter circuit of FIG. 7 has a large gain, sharp peak characteristics, and steep frequency characteristics, which are observed by the expression (1), In this situation, the following expressions (2) and (3) are satisfied.

$$|GgK| \approx 1$$  expression (2)

$$\angle[Gg|K|\exp(j\angle ZK)] \approx 2\pi$$  expression (3)

where in the real part of the expression (1), when $Re[Gg|K|\exp(j\angle K)] > 1$ is satisfied, the filter circuit oscillates. By making the frequency (center frequency) in a state of immediately before the oscillation, the recursive filter circuit functions properly as a filter.

With the above conditions, there are three following conditions for controlling the recursive filter circuit to operate properly as a filter.

That is, in consideration of a closed-loop circuit composed of the variable gain amplifier, the phase shifter, and the adder, the following conditions can be extracted from $|GgK| \approx 1$.

The amplitude of the output signal Vout and that of the feedback signal Vf are substantially same with each other.

The loop gain $|GgK|$ is made slightly smaller than 1.

Likewise, in consideration of a closed-loop circuit composed of the variable gain amplifier, the phase shifter, and the adder, the following conditions can be extracted from $\angle[Gg|K|\exp(j\angle K)] \approx 2\pi$.

The phase of the output signal Vout and that of the feedback signal Vf are substantially same with each other.

PRIOR ART DOCUMENTS

Non-Patent Documents

Non-Patent Document: Vol. 108, NO. 212 (US2008 32-46) The Institute of Electronics, Information and Communication Engineers, Page 57-61 2008

SUMMARY OF THE INVENTION

Problem to be Solved by the Invention

In the control of the recursive filter circuit, as shown in FIG. 8, a phase adjusting voltage is input to the phase shifter 303 and a gain adjusting voltage is input to the variable gain amplifier 304, so that the phase and gain are controlled. Such adjustments are carried out by, for example, manually changing the gain of the variable gain amplifier 304 and the phase of the phase shifter 303 and setting appropriate values thereof without oscillation, while monitoring the output signal Vout by use of a spectrum analyzer or the like.

It is to be noted that, however, it is difficult to manually adjust the gain of the variable gain amplifier or the phase of the phase shifter, by use of an external device such as a spectrum analyzer or the like.

The present invention has been made in view of the above-described circumstances, and has an object to provide a filter device having functions of automatically changing, setting, and adjusting the center frequency to be filtered by a filter circuit and a control method thereof.

Solution to the Problem

In order to solve the above problem, according to an aspect of the present invention, there is provided a filter device including: a filter circuit (for example, a filter core unit 102 illustrated in FIG. 1) having a positive feedback therein; and a control circuit (for example, a frequency comparing circuit 103 illustrated in FIG. 1) for controlling a center frequency of the filter circuit, wherein the control circuit sets the filter circuit in an oscillation state, while the center frequency is being controlled.

The filter device according to the present invention, in the above invention, preferably, the filter circuit is a recursive filter circuit.

The filter device according to the present invention, in the above invention, the recursive filter circuit may include: an adder (for example, an adder 109 illustrated in FIG. 1) for outputting an added signal in which an input signal and a feedback signal are added; a variable gain amplifier (for example, an AGC circuit 110 illustrated in FIG. 1) for generating an amplification signal by amplifying the added signal output from the adder by a desired amplification factor; and a phase shifter (for example, a phase shifter 111 illustrated in FIG. 1) for shifting a phase of the amplification signal amplified by the variable gain amplifier by any shift amount, generating the feedback signal, and inputting the feedback signal to the adder.

The filter device according to the present invention, in the above invention, the control circuit may include: a gain controller (for example, a gain control voltage generator 108 illustrated in FIG. 1) for generating a gain control signal of controlling the amplification factor of the variable gain amplifier in accordance with an amplitude of the feedback signal; and a phase controller (for example, a phase shifter control voltage generator 117 illustrated in FIG. 1) for generating a phase shifter control signal of controlling a shift amount of the phase of the amplification signal in the phase shifter in accordance with a frequency of the feedback signal.

The filter device according to the present invention, in the above invention, the gain controller may include: an amplitude comparing circuit (for example, a comparator 107 illustrated in FIG. 1) for comparing a reference amplitude that is an amplitude set as the reference and the amplitude of the feedback signal; and a gain control circuit (for example, the gain control voltage generator 108 illustrated in FIG. 1) for generating a gain control signal of controlling the amplification factor of the variable gain amplifier based upon a comparison result of the amplitude comparing circuit, and the phase controller may include: a frequency comparing circuit (for example, a comparator 116 illustrated in FIG. 1) for comparing the reference frequency that is the frequency set as the reference and the frequency of the feedback signal; and a phase control circuit (for example, a phase shifter control voltage generator 117 illustrated in FIG. 1) for generating the phase shifter control signal of controlling the shift amount of the phase of the amplification signal in the phase shifter.

The filter device according to the present invention, in the above invention, the gain control circuit may set the filter circuit in the oscillation state, while the amplification factor of the variable gain amplifier or the shift amount of the phase shifter is being controlled.

The filter device according to the present invention, in the above invention, may further include an amplification circuit (for example, an LNA 120 illustrated in FIG. 1) for amplifying the input signal to be input to the filter circuit, and the amplification circuit stops inputting the input signal to the filter circuit, while the center frequency of the filter circuit is being controlled.

The filter device according to the present invention, in the above invention, the gain control circuit may generate the gain control signal of increasing the amplification factor of the signal in the variable gain amplifier, when the reference amplitude is greater than the amplitude of the feedback signal as the comparison result in the amplitude comparing circuit, and wherein the gain control circuit may generate the gain control signal of reducing the amplification factor of the signal in the variable gain amplifier, when the reference amplitude is smaller than the amplitude of the feedback signal as the comparison result in the amplitude comparing circuit.

The filter device according to the present invention, in the above invention, the gain control circuit may consecutively generate the gain control signal several times, and generates the gain control signal previously generated when the amplitude of the feedback signal is greater than the reference amplitude to make the amplitude of the feedback signal smaller than the reference amplitude.

The filter device according to the present invention, in the above invention, the phase shifter control circuit may generate the phase shifter control signal for increasing the frequency of the feedback signal in the phase shifter, when the reference frequency is greater than the frequency of the feedback signal, and the phase shifter control circuit may generate the phase shifter control signal for reducing the frequency of the feedback signal in the phase shifter, when the reference frequency is smaller than the frequency of the feedback signal.

The filter device according to the present invention, in the above invention, the phase control circuit may generate the phase shifter control signal for operating the phase shifter to make the reference frequency substantially identical to the frequency of the feedback signal.

The filter device according to the present invention, in the above invention, the filter circuit may stop the oscillation state and operates as a filter, after the center frequency of the filter circuit is controlled.

According to another aspect of the present invention, there is provide a control method of a filter device comprising a filter circuit having a positive feedback therein and a control circuit for controlling a center frequency of the filter circuit, wherein the filter circuit is set in an oscillation state, while the center frequency is being controlled.

The control method of the filter device according to the present invention, in the above invention, preferably, the filter circuit is a recursive filter circuit.

The control method of the filter device according to the present invention, in the above invention, may include: an oscillation state setting step of setting the filter circuit in an oscillation state; an adjusting step of adjusting a gain and a frequency of the filter circuit to make an output voltage of the filter circuit same with a reference voltage and make an oscillation frequency same with a reference frequency; and an oscillation stopping step of stopping the oscillation state of the filter circuit.

The control method of the filter device according to the present invention, in the above invention, the adjusting step may include: an initial value setting step of setting initial values of the gain and the frequency; an modulating step of comparing the output voltage and the reference voltage and modulating a value of the gain when the output voltage and the reference voltage are different, and comparing the oscillation frequency and the reference frequency and modulating a value of the frequency when the oscillation frequency and the reference frequency are different, wherein the modulating step is repeated several times to make the output voltage of the filter circuit same with the reference voltage and make the oscillation frequency of the filter circuit same with the reference frequency.

The control method of the filter device according to the present invention, in the above invention, the modulating step may include: a gain modulating step of increasing the gain when the reference voltage is greater than the output voltage, and reducing the gain when the reference voltage is smaller than the output voltage; and a frequency modulating step of increasing the frequency when the reference frequency is greater than the oscillation frequency, and reducing the frequency when the reference frequency is smaller than the oscillation frequency.

The control method of the filter device according to the present invention, in the above invention, the filter circuit may stop the oscillation state and operates as a filter, after the center frequency of the filter circuit is controlled.

Advantageous Effects of the Invention

According to an aspect of the present invention, the amplification factor of the variable gain amplifier and the phase shift of the amplification signal in the phase shifter allow automatic control of the gain and the amplification factor of the output signal. Specifically, when the amplification factor and the phase shift amount are adjusted, the filter main body is oscillated, thereby matching the output signal with the reference amplitude and the reference frequency within a short period. Accordingly, it is possible to provide a filter circuit having functions of automatically adjusting the gain of the variable gain amplifier and the phase shift amount of the phase shifter to change, set, and adjust the center frequency of the filter circuit with ease.

Additionally, according to another aspect of the present invention, the amplification factor and the phase can be controlled without being influenced from the exterior.

Furthermore, according to further another aspect of the present invention, the reference amplitude and the amplitude of the feedback signal can be matched with each other.

Moreover, according to yet another aspect of the present invention, when the amplitude of the feedback signal is greater than the reference amplitude, the gain control signal that has been generated previously is generated. It is therefore possible to make the amplitude of the feedback signal smaller than the reference amplitude with ease.

Moreover, according to yet another aspect of the present invention, when the reference frequency is greater than the frequency of the feedback signal, the frequency of the feedback signal is increased, whereas when the reference frequency is smaller than the frequency of the feedback signal, the frequency of the feedback signal is reduced. Accordingly, the difference between the feedback signal and the reference frequency is gradually made smaller, so that the feedback signal can be matched with the reference amplitude and the reference frequency.

Moreover, according to yet another aspect of the present invention, the reference frequency and the frequency of the feedback signal are made substantially same with each other.

Moreover, according to yet another aspect of the present invention, the filter operation is enabled without oscillation after the adjustment.

BRIEF DESCRIPTION OF THE DRAWINGS

FIG. 5A to FIG. 5C are timing charts illustrative of output voltage and oscillation frequency in the adjustment of the filter core unit, according to an embodiment of the present invention;

DESCRIPTION OF EMBODIMENTS

Hereinafter, an embodiment of the present invention will be described with reference to the drawings.

Configuration (1) Overall Configuration

Figure 1:
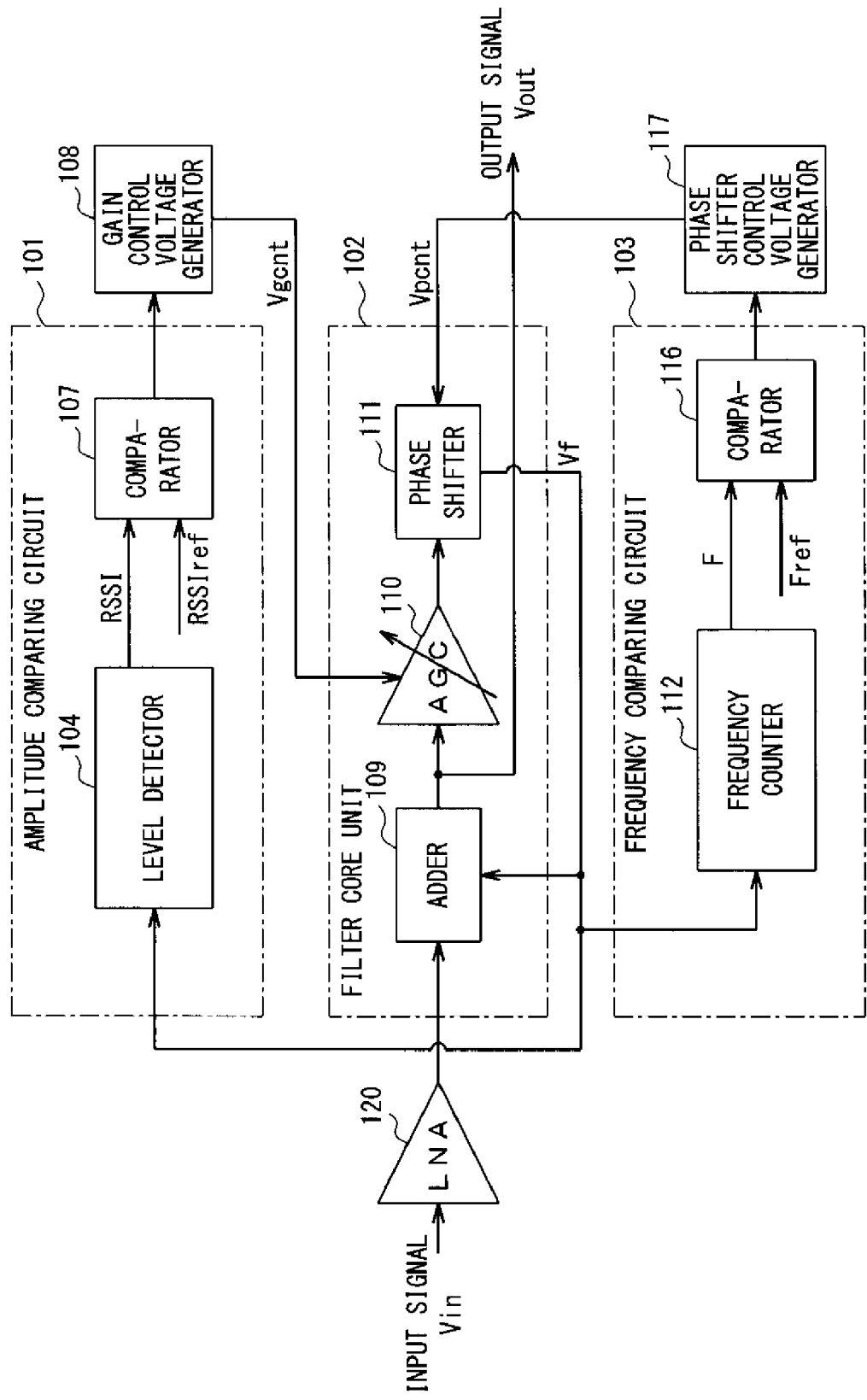
FIG. 1 is a view illustrative of a filter device according to an embodiment of the present invention.

FIG. 1 is a view illustrative of a filter device according to an embodiment of the present invention. The filter device includes a filter circuit and a control circuit of the filter circuit (hereinafter, simply referred to as control circuit). The filter circuit may be any circuit as long as it includes a positive feedback therein, and an example thereof is a recursive filter circuit.

The illustrated filter device is provided with: an amplitude comparing circuit 101 for comparing the amplitudes of signals; a frequency comparing circuit 103 for comparing the frequencies; a gain control voltage generator 108; a phase shifter control voltage generator 117; and a filter core unit 102. In such a configuration, the amplitude comparing circuit 101, the frequency comparing circuit 103, the gain control voltage generator 108, the phase shifter control voltage generator 117 correspond to a control circuit, and the filter core unit 102 corresponds to a main body of the filter circuit controlled by the control circuit.

Figure 7:
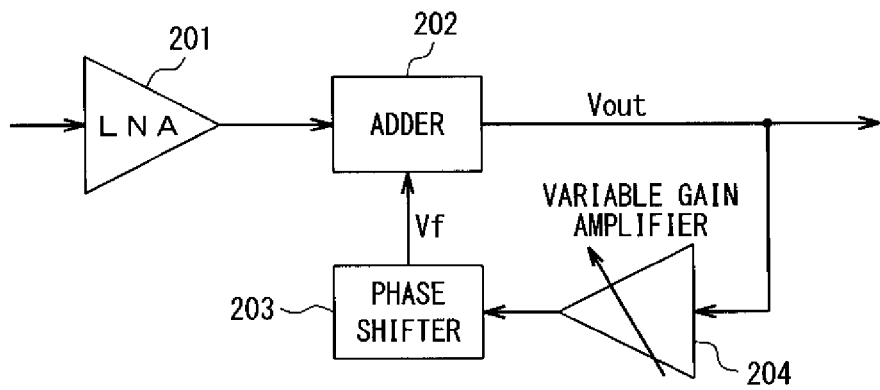
FIG. 7 is a view showing a conventional recursive filter circuit.
Figure 8:
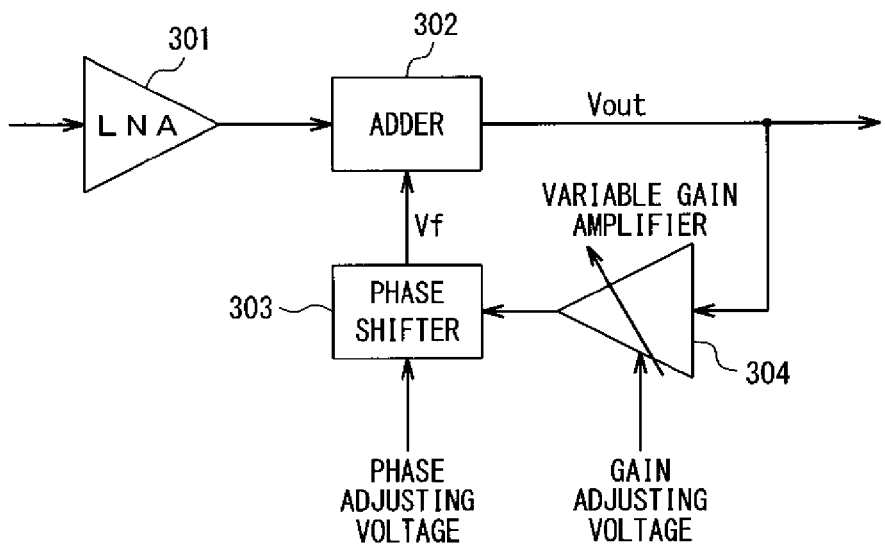
FIG. 8 is a view showing the control of the conventional recursive filter circuit.

The filter core unit 102 is a recursive filter circuit configured in the same manner as that of FIG. 7 shown as a conventional technique. Signals output from a Low Noise Amplifier (LNA) 120 are input to the filter core unit 102. The filter core unit 102 is provided with: an adder 109; an Automatic Gain Control (AGC) circuit 110; and a phase shifter 111.

The output voltage Vout from the adder 109 is input to the AGC circuit 110. The AGC circuit 110 adjusts the gain of the output signal Vout from the adder 109, and outputs the signal to the phase shifter 111. The feedback signal Vf output from the phase shifter 111 is output to the amplitude comparing circuit 101 and the frequency comparing circuit 103.

In the above-described configuration, the gain control voltage generator 108 makes the filter core unit 102 into an oscillation state, while the amplification factor of the amplitude comparing circuit 101 or the shift amount of the phase shifter 111 is being controlled. It is to be understood that the oscillation state mentioned in the present embodiment denotes the state where a signal having a predetermined frequency is output from the filter core unit 102 without inputting a signal to the filter core unit 102.

(2) Filter Core Unit

Figure 2:
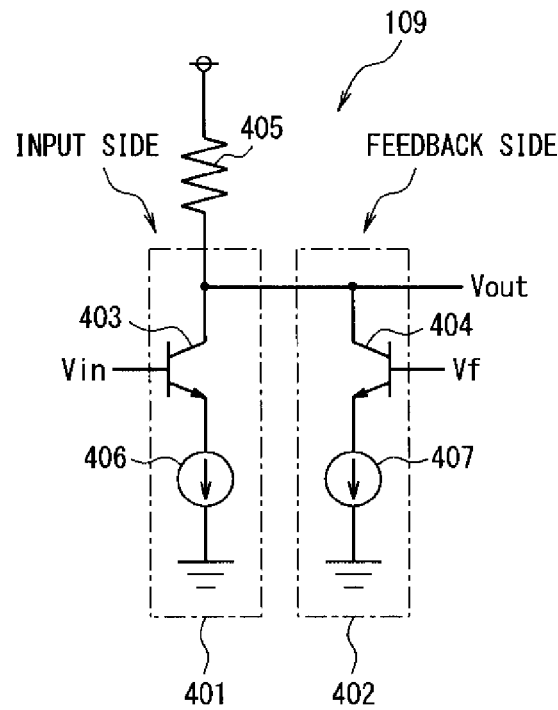
FIG. 2 is a circuit diagram illustrative of an example of an adder in a filter core unit illustrated in FIG. 1.

FIG. 2 is a circuit diagram illustrative of an example of the adder 109 in the filter core unit 102 illustrated in FIG. 1. The adder 109 is provided with: a bipolar transistor 403 for receiving at the base terminal the signal output from the LNA 120 as an input signal Vin; and a bipolar transistor 404 for receiving at the base terminal the feedback signal Vf output from the phase shifter 111 illustrated in FIG. 1, and outputting the output signal Vout from the collector to the AGC circuit 110.

In the adder 109, an input side 401 refers to a portion including the bipolar transistor 403 and a current source 406, whereas a feedback side 402 refers to a portion including the bipolar transistor 404 and a current source 407.

In the input side 401, the collector of the bipolar transistor 403 is connected to the reference potential through a resistance element 405, and the emitter is grounded through the current source 406. Likewise, in the feedback side 402, the emitter of the bipolar transistor 404 is grounded through the current source 407, the collector of the bipolar transistor 404 is connected to the output terminal, and the output signal Vout is output from the output terminal.

Figure 3:
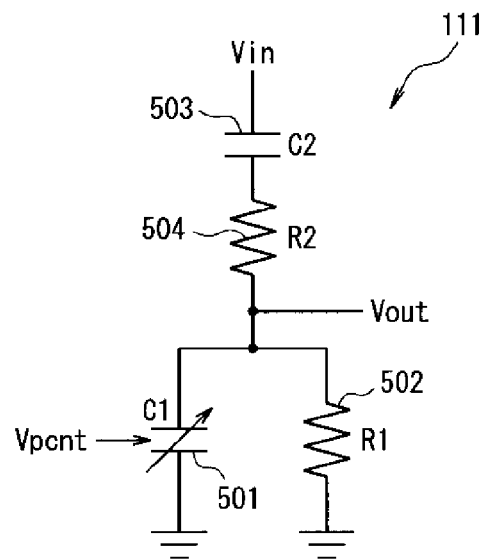
FIG. 3 is a view illustrative of a configuration example of a phase shifter in the filter core unit illustrated in FIG. 1.

FIG. 3 is a view illustrative of a configuration example of the phase shifter 111 in the filter core unit 102 illustrated in FIG. 1. The illustrated phase shifter 111 is a Wien bridge type of phase shifter. The signal output from the AGC circuit 110 is input to the phase shifter 111 illustrated in FIG. 3, as an input signal Vin. The terminal to which the input signal Vin is input is connected in series with a capacitor 503 and a resistance element 504, whereas the other terminal of the resistance element 504 is connected in parallel with a capacitor 501 and a resistance element 502. The other terminal of the capacitor 501 and the other terminal of the resistance element 502 are both grounded.

As illustrated in FIG. 3, C2 refers to the capacitance value of the capacitor 503, C1 refers to the capacitance value of the capacitor 501, R2 refers to the resistance value of the resistance element 504, and R1 refers to the resistance value of the resistance element 502. In such a circuit, any of the resistance values of R1 and R2 and the capacitance values of C1 and C2 is changed to change the phase of the input signal Vin and output the signal as an output signal Vout.

In the example illustrated in FIG. 3, the capacitor 501 is configured with a variable capacitance element (varactor) and the value of C1 is controlled by a phase shifter control signal Vpcnt to change the phase of the input signal Vin.

Figure 4:
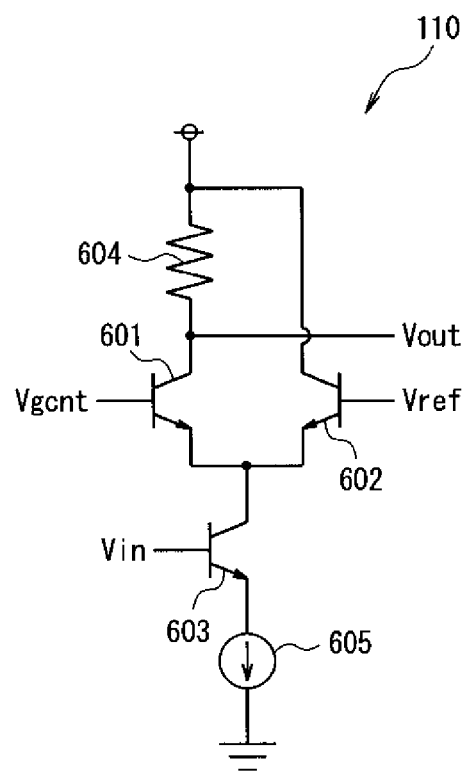
FIG. 4 is a view illustrative of an AGC circuit in the filter core unit illustrated in FIG. 1.

FIG. 4 is a view illustrative of the AGC circuit 110 in the filter core unit 102 illustrated in FIG. 1. In the AGC circuit 110 illustrated in FIG. 4, one end of a resistance element 604 is connected to the reference potential and the other end of the resistance element 604 is connected to a bipolar transistor 601. The emitter of the bipolar transistor 601 is connected to a bipolar transistor 603. A bipolar transistor 602 is connected between the reference potential and the collector of the bipolar transistor 603. Moreover, the emitter of the bipolar transistor 603 is grounded through a current source 605.

In the AGC circuit 110 illustrated in FIG. 4, a reference voltage Vref is input to the base terminal of the bipolar transistor 602, whereas a gain control voltage Vgcnt is input to the base terminal of the bipolar transistor 601. In the AGC circuit 110, the gain control voltage Vgcnt is changed with respect to the reference voltage Vref, thereby changing the current flowing across the transistor on the gain pass side (in FIG. 4, the bipolar transistor 601 connected to the resistance element 604). Consequently, the gain of the AGC circuit 110 can be changed.

(3) Amplitude Comparing Circuit

The amplitude comparing circuit 101 illustrated in FIG. 1 receives the feedback signal Vf output from the phase shifter 111 in the filter core unit 102, and outputs a comparison result between the amplitude thereof and the reference amplitude to the gain control voltage generator 108.

Accordingly, the amplitude comparing circuit 101 is provided with: a level detector 104 for converting the amplitude of the feedback signal Vf to a DC voltage; and a comparator 107 for comparing an output voltage RSSI (Receive Signal Strength Indicator) from the level detector 104 and a reference amplitude voltage RSSIref. In the amplitude comparing circuit 101, the output voltage RSSI is output from the level detector 104 to be compared with the reference amplitude voltage RSSIref.

The gain control voltage generator 108 generates a gain control signal Vgcnt based upon the comparison result of the amplitudes by the comparator 107. The gain control signal Vgcnt is input to the AGC circuit 110 in the filter core unit 102. The gain control signal Vgcnt allows the gain control voltage generator 108 to control the gain adjustment in the AGC circuit 110.

Additionally, in the present embodiment, the gain control voltage generator 108 repeatedly generates the gain control signal Vgcnt at a prescribed time interval, and outputs the signal. For this reason, the gain control signal Vgcnt having multiple values is consecutively output at a prescribed time interval.

(4) Frequency Comparison Circuit

The frequency comparing circuit 103 illustrated in FIG. 1, receives the feedback signal Vf and outputs a relative difference in frequency from the frequency thereof and the reference frequency to the phase shifter control voltage generator 117. Therefore, the frequency comparing circuit 103 is provided with: a frequency counter 112 for counting the frequency of the feedback signal Vf; and a comparator 116 for comparing the frequency F of the feedback signal Vf and the reference frequency Fref. The phase shifter control voltage generator 117 generates the phase shifter control signal Vpcnt based upon the comparison result of the frequencies by the comparator 116. The phase shifter control signal Vpcnt is input to the phase shifter 111 in the filter core unit 102 to control the phase shift in the phase shifter 111.

Operations (1) Adjustment of Filtering Frequency of Recursive Filter Circuit

Next, a description will be given of operations in adjusting the filtering frequency of the filter core unit 102 with the above-described configuration.

The amplitude and the frequency of the signal output from the filter core unit 102 can be changed arbitrarily by adjusting the gain control signal Vgcnt input to the AGC circuit 110 and the phase shifter control signal Vpcnt input to the phase shifter 111.

That is, the filter core unit 102 is set in the oscillation state as described above, in the adjustment of the AGC circuit 110 and the phase shifter 111. Then, in the present embodiment, the LNA 120 is turned off (powered down) so that no signal should be input to the filter core unit 102 from the exterior. Specifically, the LNA 120 may be turned off by use of a digital circuit, not illustrated.

In the present embodiment, when the filter core unit 102 is brought into the oscillation state, the amplitude of the AGC circuit 110 or the shift amount of the phase shifter 111 is adjusted by use of the feedback signal Vf output from the filter core unit 102. Moreover, in the description below, an oscillation frequency FOSC refers to the frequency F of the feedback signal Vf when the filter core unit 102 is in the oscillation state.

FIG. 5A to FIG. 5C are timing charts illustrative of the magnitude of the output voltage RSSI and the oscillation frequency FOSC in time axis, in the adjustment of the filter core unit 102.

FIG. 5A is a timing chart of the output voltage RSSI, FIG. 5B illustrates comparisons of the output voltage (amplitude) RSSI and the oscillation frequency FOSC with the reference amplitude voltage RSSIref and the reference frequency Fref, respectively, and FIG. 5C is a timing chart of the oscillation frequency FOSC.

In FIG. 5B, "1" indicates a state where the output voltage RSSI exceeds the reference amplitude voltage RSSIref, and "0" indicates a state where the output voltage RSSI falls below the reference amplitude voltage RSSIref. In addition, "1" indicates a state where the oscillation frequency FOSC exceeds the reference frequency Fref, and "0" indicates a state where the oscillation frequency FOSC falls below the reference frequency Fref.

Furthermore, in FIG. 5, although a state where the oscillation of the filter core unit 102 stops, that is the "0" state where the output voltage RSSI falls below the reference amplitude voltage RSSIref is partially included, FIG. 5C is a timing chart of the oscillation frequency FOSC of the feedback signal Vf when the filter core unit 102 is in the oscillation state, for convenience.

(2) Amplitude Control in the Oscillation

In the present embodiment, in the adjustment of the filter core unit 102, firstly, the gain control voltage generator 108 increases the gain of the AGC circuit 110 to set the filter core unit 102 in the oscillation state. The timing when the oscillation state is brought is indicated by a time t0 in FIG. 5. The feedback signal Vf is input to the level detector 104, and is then converted to a DC voltage therein. The amplitude of the output voltage RSSI after conversion is compared with that of the reference amplitude voltage RSSIref. The signal indicative of a comparison result (the magnitude relation between the reference amplitude voltage RSSIref and the output voltage RSSI) is input to the gain control voltage generator 108.

In the gain control voltage generator 108, when the reference amplitude voltage RSSIref is smaller than the output voltage RSSI, the gain control signal Vgcnt is adjusted to make the AGC circuit 110 operate to decrease the gain. The operation timings of the AGC circuit 110 are indicated by t1, t3 in FIG. 5.

On the other hand, when the reference amplitude voltage RSSIref is greater than the output voltage RSSI, the gain control voltage generator 108 adjusts the gain control signal Vgcnt so that the AGC circuit 110 should increase the gain. This adjustment is achieved by making the amplitude of the feedback signal Vf slightly greater than the reference amplitude. The timing of the adjustment is indicated by t5 in FIG. 5. This control is aimed at maintaining the state where the filter core unit 102 is always recognized as the oscillation state.

According to the present embodiment as described, it is made possible to output a signal having a prescribed frequency from the filter circuit by merely storing the reference amplitude voltage RSSIref and the reference frequency Fref in a memory, for example, without inputting the signal as a reference to the filter core unit 102.

(3) Control of Frequency at the Oscillation

The feedback signal Vf is digitalized in the frequency counter 112. The frequency F of the digitalized feedback signal Vf and the reference frequency Fref are input to the comparator 116, and then the comparator 116 compares the magnitudes of the frequencies. The signal indicative of a comparison result (magnitude relation between the reference frequency Fref and the frequency of the feedback signal Vf) is input to the phase shifter control voltage generator 117.

When the filter core unit 102 is in the oscillation state and the reference frequency Fref is greater than the oscillation frequency FOSC of the feedback signal Vf, the phase shifter control voltage generator 117 adjusts the phase shifter control signal Vpcnt so that the oscillation frequency FOSC is greater in the phase shifter 111 (this adjustment timings are indicated by t7, t9 in FIG. 5). Then, when the magnitude relation between the reference frequency Fref and the oscillation frequency FOSC of the feedback signal is reversed (this timing is indicated by t9 in FIG. 5), the phase shifter control voltage generator 117 controls the phase shifter control signal Vpcnt so that the reference frequency Fref and the oscillation frequency FOSC are substantially same with each other (t10 and later in FIG. 5).

Moreover, in the control of making the reference frequency Fref and the oscillation frequency FOSC substantially same with each other, since the phase shifter control signal Vpcnt is repeatedly output several times in the present embodiment, the phase shifter control signal Vpcnt that has been previously output is generated again. With such a configuration, the reference frequency Fref and the oscillation frequency FOSC of the feedback signal Vf are substantially same with each other.

Specifically, the phase shifter control signal Vpcnt that has been previously output may be, for example, the phase shifter control signal Vpcnt that has been output immediately before, or may be the phase shifter control signal Vpcnt that has been output a prescribed number of times before. The generation of the phase shifter control signal Vpcnt, which has been output immediately before, hereinafter refers to as "return to the last state".

On the other hand, when the reference frequency Fref is smaller than the oscillation frequency FOSC of the feedback signal Vf, the phase shifter control signal Vpcnt is adjusted so that the oscillation frequency FOSC is reduced in the phase shifter 111. Moreover, when the magnitude relation between the reference frequency Fref and the oscillation frequency FOSC of the feedback signal Vf is reversed, for example, the phase shifter control signal Vpcnt that has been generated immediately before, so that the reference frequency Fref and the oscillation frequency FOSC of the feedback signal Vf can be made substantially same with each other.

(4) Gain Control

In addition, the oscillation of the filter core unit 102 is made to stop so that the filter core unit 102 operates as a filter. For this reason, the gain control voltage generator 108 lowers a certain amount of the gain control voltage Vgcnt. This operation timing is indicated by t11 in FIG. 5. The filter core unit 102 is adjusted by the operation described heretofore, thereby adjusting the bandpass frequency of the recursive RF filter and achieving the state where the filter circuit has a high Q value and gain.

Figure 6:
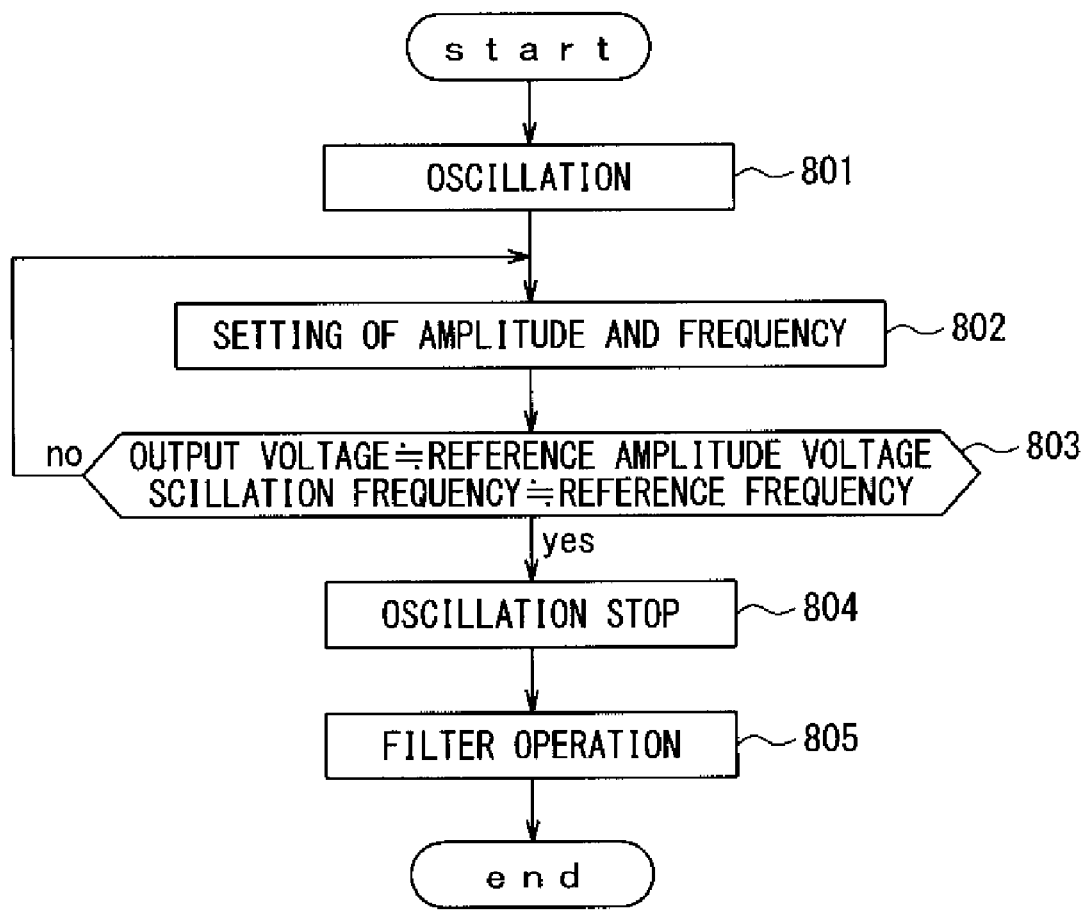
FIG. 6 is a flowchart of operating the filter device as a filter, after a gain and a frequency of the filter core unit, according to an embodiment of the present invention, are adjusted.

FIG. 6 is a flowchart of operating the filter device as a filter after the gain and the frequency of the filter core unit 102, according to an embodiment of the present invention, are adjusted.

In the present embodiment, in the adjustment of the filter core unit 102, firstly at step 801, the gain control voltage generator 108 increases the gain of the AGC circuit 110 to set the filter core unit 102 in the oscillation state.

Next, at step 802 and step 803, the gain and the frequency are adjusted. Firstly, at step 802, the gain and the frequency are set. At step 803, when the output voltage RSSI is different from the reference amplitude voltage RSSIref, the gain of the AGC circuit 110 is modulated by the gain control voltage generator 108. When the oscillation frequency FOSC is different from the reference frequency Fref, the phase shifter control voltage generator 117 modulates the phase of the phase shifter 111. Such modulation is repeated several times. When the output voltage RSSI is substantially same with the reference amplitude voltage RSSIref and the oscillation frequency FOSC is substantially same with the reference frequency Fref, the adjustments of the gain and the frequency are finished.

Finally, after the oscillation stops at step 804, the filter device operates as a filter at step 805.

According to the present embodiment described heretofore, it is possible to provide a filter circuit having a positive feedback such as a recursive filter circuit, whereby the gain of the AGC circuit 110 or the phase of the phase shifter 111 is automatically adjusted, so that the gain or the phase of the core unit of the filter device is automatically adjustable.

INDUSTRIAL AVAILABILITY

The present invention, as described heretofore, is applicable to any circuit as long as it has a main body of a filter circuit with a positive feedback, such as a recursive filter circuit, and the main body of the filter circuit is adjustable.

REFERENCE SIGNS LIST 101 amplitude comparing circuit
102 filter core unit
103 frequency comparing circuit
104 level detector
107, 116 comparator
108 gain control voltage generator
109 adder
110 AGC circuit
111 phase shifter
112 frequency counter
117 phase shifter control voltage generator
120 LNA circuit

The invention claimed is:

1. A filter device, comprising:
a filter circuit comprising a positive feedback portion therein; and
a control circuit configured to:
control a center frequency of an oscillation state output of the filter circuit; and
set the filter circuit in the oscillation state, while the center frequency is being controlled,
wherein the filter circuit comprises a recursive filter circuit, and
wherein the recursive filter circuit comprises:
an adder for outputting an added signal in which an input signal and a feedback signal are added,
a variable gain amplifier for generating an amplification signal by amplifying the added signal output from the adder by a desired amplification factor, and
a phase shifter for shifting a phase of the amplification signal amplified by the variable gain amplifier by any shift amount, generating a feedback signal for the positive feedback, and inputting the feedback signal to the adder.

2. The filter device according to claim 1, wherein the control circuit comprises:
a gain controller for generating a gain control signal of controlling the amplification factor of the variable gain amplifier in accordance with an amplitude of the feedback signal; and
a phase controller for generating a phase shifter control signal of controlling a shift amount of the phase of the amplification signal in the phase shifter in accordance with a frequency of the feedback signal.

3. The filter device according to claim 2, wherein:
the gain controller comprises:
an amplitude comparing circuit for comparing a reference amplitude that is an amplitude set as the reference and the amplitude of the feedback signal; and
a gain control circuit for generating a gain control signal of controlling the amplification factor of the variable gain amplifier based upon a comparison result of the amplitude comparing circuit; and
the phase controller comprises:
a frequency comparing circuit for comparing the reference frequency that is the frequency set as the reference and the frequency of the feedback signal; and
a phase control circuit for generating the phase shifter control signal of controlling the shift amount of the phase of the amplification signal in the phase shifter.

4. The filter device according to claim 3, wherein the gain control circuit sets the filter circuit in the oscillation state, while the amplification factor of the variable gain amplifier or the shift amount of the phase shifter is being controlled.

5. The filter device according to claim 4, further comprising an amplification circuit for amplifying an input signal to be input to the filter circuit, and the amplification circuit stops inputting the input signal to the filter circuit, while the center frequency of the filter circuit is being controlled.

6. The filter device according to claim 3, wherein:
the gain control circuit generates the gain control signal of increasing the amplification factor of the signal in the variable gain amplifier, when the reference amplitude is greater than the amplitude of the feedback signal as the comparison result in the amplitude comparing circuit; and
the gain control circuit generates the gain control signal of reducing the amplification factor of the signal in the variable gain amplifier, when the reference amplitude is smaller than the amplitude of the feedback signal as the comparison result in the amplitude comparing circuit.

7. The filter device according to claim 6, wherein the gain control circuit consecutively generates the gain control signal several times, and generates the gain control signal previously generated when the amplitude of the feedback signal is greater than the reference amplitude to make the amplitude of the feedback signal smaller than the reference amplitude.

8. The filter device according to claim 3, wherein:
the phase shifter control circuit generates the phase shifter control signal for increasing the frequency of the feedback signal in the phase shifter, when the reference frequency is greater than the frequency of the feedback signal; and
the phase shifter control circuit generates the phase shifter control signal for reducing the frequency of the feedback signal in the phase shifter, when the reference frequency is smaller than the frequency of the feedback signal.

9. The filter device according to claim 8, wherein the phase control circuit generates the phase shifter control signal for operating the phase shifter to make the reference frequency substantially identical to the frequency of the feedback signal.

10. The filter device according to any one of claim 1 to claim 11, wherein the filter circuit stops the oscillation state and operates as a filter, after the center frequency of the filter circuit is controlled.

11. A control method of a filter device comprising a filter circuit comprising a positive feedback portion therein and a control circuit for controlling a center frequency of an oscillation state output of the filter circuit and setting the filter circuit in the oscillation state, while the center frequency is being controlled, the method comprising:
an oscillation state setting operation of setting the filter circuit in an oscillation state;
an adjusting operation of adjusting a gain and a frequency of the filter circuit to:
make an output voltage of the filter circuit same with a reference voltage; and
make an oscillation frequency same with a reference frequency; and
an oscillation stopping operation of stopping the oscillation state of the filter circuit,
wherein the filter circuit comprises a recursive filter circuit.

12. The control method according to claim 11, wherein the adjusting operation comprises:
  an initial value setting operation of setting initial values of the gain and the frequency;
  a modulating operation of:
    comparing the output voltage and the reference voltage and modulating a value of the gain when the output voltage and the reference voltage are different;
    comparing the oscillation frequency and the reference frequency; and
    modulating a value of the frequency when the oscillation frequency and the reference frequency are different,
  wherein the modulating operation is repeated several times to make the output voltage of the filter circuit same with the reference voltage and make the oscillation frequency of the filter circuit same with the reference frequency.

13. The control method according to claim 12, wherein the modulating operation comprises:
  a gain modulating operation of:
    increasing the gain when the reference voltage is greater than the output voltage; and
    reducing the gain when the reference voltage is smaller than the output voltage; and
  a frequency modulating operation of:
    increasing the frequency when the reference frequency is greater than the oscillation frequency; and
    reducing the frequency when the reference frequency is smaller than the oscillation frequency.

14. The control method according to any one of claim 11 to claim 13, wherein the filter circuit stops the oscillation state and operates as a filter, after the center frequency of the filter circuit is controlled.

* * * * *